United States Patent [19]

Miyatake et al.

[11] Patent Number: 4,734,890
[45] Date of Patent: Mar. 29, 1988

[54] DYNAMIC RAM HAVING FULL-SIZED DUMMY CELL

[75] Inventors: Hideshi Miyatake; Kazuyasu Fujishima; Masaki Kumanoya; Hideto Hidaka; Katsumi Dosaka; Yasuhiro Konishi, all of Hyogo, Japan

[73] Assignee: Mitsubishi Denki Kabushiki Kaisha, Tokyo, Japan

[21] Appl. No.: 929,369

[22] Filed: Nov. 12, 1986

[30] Foreign Application Priority Data

Nov. 13, 1985 [JP] Japan .................................. 60-257081

[51] Int. Cl.⁴ ...................... G11C 11/40; G11C 13/00
[52] U.S. Cl. ...................................... 365/210; 365/203
[58] Field of Search ................ 365/189, 203, 210, 230

[56] References Cited

U.S. PATENT DOCUMENTS 4,648,074 3/1987 Pollachek ............................ 365/210

Primary Examiner—Terrell W. Fears
Attorney, Agent, or Firm—Lowe, Price, LeBlanc, Becker & Shur

[57] ABSTRACT

A dynamic RAM has dummy capacitors (C6, C7) having the same capacitance as a memory capacitor connected to a pair of bit lines (BL1, $\overline{BL1}$), respectively. During an active period, respective dummy capacitors (C6, C7) are charged to the H level and L level, which are signal levels of the bit lines (BL1, $\overline{BL1}$) and during precharge period, both dummy capacitors are equalized. Since both dummy capacitors (C6, C7) respectively connected to a pair of bit lines (BL1, $\overline{BL1}$) are equalized during precharge period, so that the stored charge values of the dummy capacitors (C6, C7) both become the intermediate value of the ground level and supply potential level.

3 Claims, 12 Drawing Figures

ELECTRIC POTENTIAL

MEMORY CELL

DUMMY CELL

WAVEFORM OF READ POTENTIAL

ELECTRIC POTENTIAL

WAVEFORM OF READ POTENTIAL

DYNAMIC RAM HAVING FULL-SIZED DUMMY CELL

BACKGROUND OF THE INVENTION

1. Field of the Invention

The present invention relates to a dynamic RAM having an improved dummy cell, and more particularly to a dynamic RAM comprising a full-sized dummy cell having equal capacitance value with a memory cell.

1. Description of the Prior Art

An array structure of a conventional dynamic RAM having a full-sized dummy cell is disclosed in, for example, the Patent Laying-Open Gazette No. 103191/1982. Since a full-sized dummy cell has the same structure as a memory cell, a read level of the dummy cell becomes an intermediate level between a read level of the memory cell in the high level information stored condition and a read level of the same in the low level information stored condition even when there is unevenness in the RAM manufacturing process, and an operation margin is surely maintained. Therefore it is effective in a highly integrated dynamic RAM employing minute processing.

However, as a substrate potential is usually applied by an inner circuit, the dynamic $\overline{RAM}$ is susceptible to fluctuation of the substrate potential and there occurs a phenomenon such that the read voltage is lost due to the fluctuation thereof.

In addition, in a conventional full-sized dummy cell system, a sensing begins after a selected dummy word line is raised to a high level and then lowered to the low level, so that the access time in the dynamic RAM is increased.

SUMMARY OF THE INVENTION

The present invention is made to solve the above described problems and its object is to provide a dynamic RAM employing a full-sized dummy cell system which does not lose read voltage even in the case of the substrate potential fluctuation and which does not increase the access time of the dynamic RAM.

In the dynamic RAM according to the present invention, a memory capacitor and a dummy capacitor having the same capacitance are provided respectively on each of a pair of bit lines. During an active period, respective dummy capacitors are charged to the signal level of the bit lines (H level, L level) and both capacitors are equalized during a precharge period.

In the dynamic RAM according to the present invention, when a substrate potential fluctuates, both the storage node of the memory cell and the storage node of the dummy cell fluctuate since the structures of the dummy cell and the memory cell are the same with each other. In addition, respective dummy capacitors connected to the respective one of a pair of bit lines are equalized during the precharge period, so that the stored charge values of both dummy capacitors become the intermediate value between the ground voltage and source voltage.

Therefore, the present invention provides a highly integrated dynamic RAM which does not lose read voltage even if the substrate potential fluctuates and which does not increase access time.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
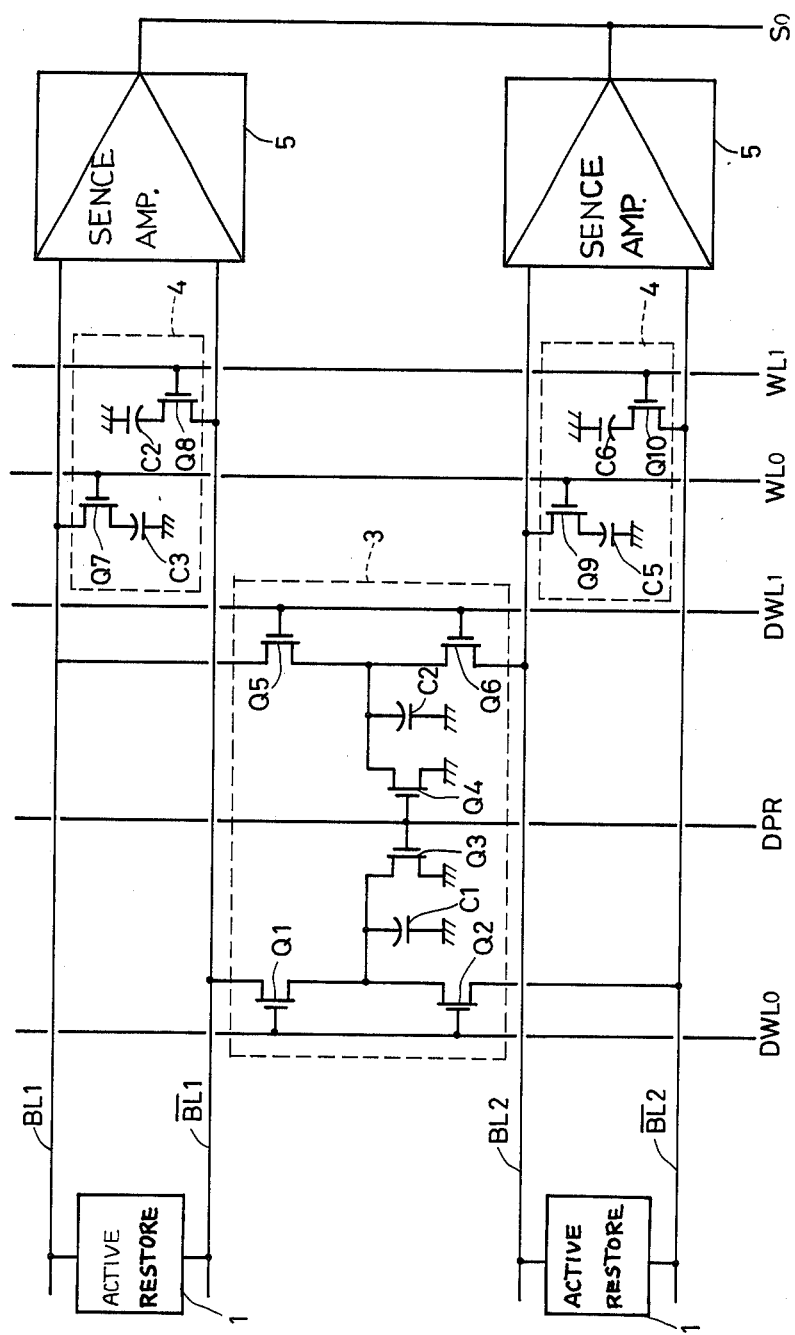
FIG. 3 is an array structure of a conventional dynamic RAM.

FIG. 3 is an array structure of a conventional dynamic RAM using a full-sized dummy cell disclosed in the Patent Laying Open Gazette No. 103191/1982. In FIG. 3, reference numeral 1 is an active restore circuit; reference characters BL1, $\overline{BL1}$, BL2 and $\overline{BL2}$ are bit lines; reference numeral 3 is a full-sized dummy cell; reference numeral 4 is a memory cell; reference numeral 5 is a sense amplifier; reference characters $DWL_0$ and $DWL_1$ are dummy word lines; reference characters $WL_0$ and $WL_1$ are word lines; reference character DPR is a dummy cell precharge signal line; reference character $S_0$ is a sense activating signal line; reference characters Q1 to Q10 are MOS transistors and reference characters C1 to C6 are MOS capacitors having capacitance value equal to each other.

Figure 4:
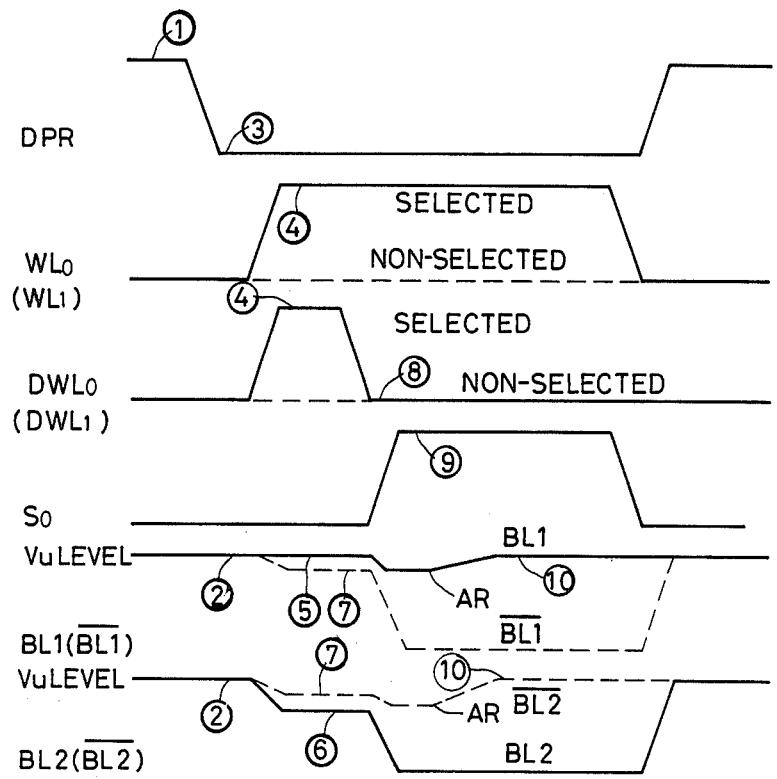
FIG. 4 is a diagram of waveforms illustrating the principle of an operation of the conventional circuit shown in FIG. 3.

FIG. 4 is a diagram of waveforms illustrating the operation of the circuit shown in FIG. 3.

Referring to the diagram of waveforms of FIG. 4, a principle of the operation of the circuit shown in FIG. 3 will be described. Circled numerals in the description show portions to be referred to in the diagram of waveform of FIG. 4.

During precharging of the dynamic RAM, the DPR signal line becomes a high level ①, and the dummy cell capacitors C1 and C2 in FIG. 3 are charged to a ground potential (a GND potential). Bit lines BL1, $\overline{BL1}$, BL2 and $\overline{BL2}$ are charged to a source potential (a Vu potential) ②.

Proceeding to the active period, the DPR signal line becomes a low level ③, and then one of the word lines and one of the dummy word lines, for example the word line WL$_0$ and the dummy word line DWL$_0$, are selected to be at the high potential level ④. On this occasion, assuming that the information of the memory cell capacitor C3 is at the Vu potential level and the information of C5 is at the GND level, the level of the bit line BL1 does not change while the level of the bit line BL2 lowers by the voltage obtained from dividing the stored charge amount (Vu×C5 capacitance value) by the bit line capacitance (capacitance value of BL2) ⑥.

On the other hand, the potential levels of the bit lines $\overline{BL1}$ and $\overline{BL2}$ lower by the voltage obtained from dividing the stored charge amount (Vu×C1 capacitance value =Vu×C5 capacitance value) by the double bit line capacitance (capacitance value of $\overline{BL1}+\overline{BL2}$) ⑦. This potential level becomes the intermediate level between the bit line BL1 potential level ⑤ and the bit line BL2 potential level ⑥, thereby enabling detection of low and high levels of the memory cell information.

After the dummy word line DWL$_0$ becomes low potential level, the sense activating signal line S$_0$ becomes high level to sense respective bit lines. Then, the active restore circuit 1 is activated (reference should be made to the AR portion in FIG. 4) to retain the high level bit line at the Vu potential level 10.

Thus the memory operation is carried out in the dynamic RAM.

A phenomenon such that the read potential is lost due to the substrate potential fluctuation will be hereinafter described.

Figure 5:
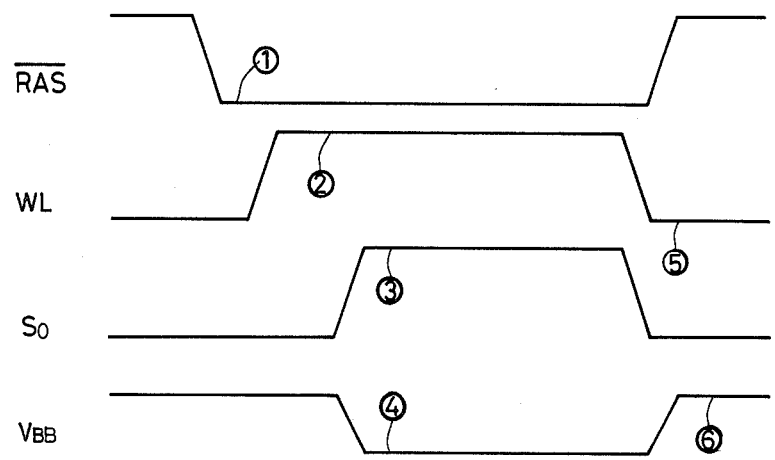
FIG. 5 is a diagram of waveforms illustrating the fluctuation of a substrate potential according to the conventional dynamic RAM.

FIG. 5 is a diagram of waveforms of an external $\overline{RAS}$ signal, accompanying word line signal WL, sense activating signal S$_0$ and the substrate potential V$_{BB}$ in the dynamic RAM. The circled numerals in the description show portions to be referred to in the waveforms of FIG. 5. When the $\overline{RAS}$ signal becomes low level ① and the word line WL becomes high level ② and after the memory cell information is read out, sensing is carried out by the high leveled S$_0$ signal ③. On this occasion, a half of the bit lines in the RAM are discharged and the substrate potential V$_{BB}$ fluctuates to the negative direction ④ due to the capacitive coupling derived from junction capacitances forming the bit lines. Then, after the word line WL becomes low level ⑤, the bit lines are precharged for the next cycle and the substrate potential V$_{BB}$ fluctuates, conversely, to the positive direction ⑥.

Figure 6:
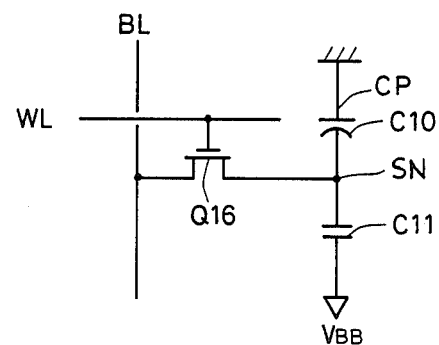
FIG. 6 is a schematic diagram of an equivalent circuit of a memory cell for describing a potential fluctuation of the storage node SN according to the conventional dynamic RAM.

FIG. 6 shows an equivalent circuit of the memory cell in the dynamic RAM. In the figure, reference character CP denotes a cell plate, reference character SN denotes a storage node, reference character Q16 denotes a MOS transistor, reference character C10 denotes a MOS capacitance and reference character C11 denotes a junction capacitance.

The aforementioned fluctuation of the substrate potential V$_{BB}$ is transmitted to the storage node SN through the junction capacitance C11. Usually, the junction capacitance C11 is about 20% of the MOS capcitance C10, so that about 20% of the change in the substrate potential V$_{BB}$ is transmitted to the storage node SN.

Meanwhile, in a highly integrated RAM, ½ Vu cell plate system has become essential in consideration of the reliability of the oxide film, as described in "A 90 ns 1 Mb DRAM with Multi-Bit Test Mode" M. Kumanoya et al., ISSCC Digest of Technical Papers pp. 240-241; February, 1985. In this ½ Vu cell plate system, since the cell plate has a high impedance, fluctuations of the substrate potential V$_{BB}$ are almost directly transmitted to the storage node SN. Therefore, in this case fluctuations of the storage node SN corresponding to fluctuations of the substrate potential V$_{BB}$ exert an undesirable influence on the reliability of the read signal from the memory cells. This will be described in the following.

Figure 7A:
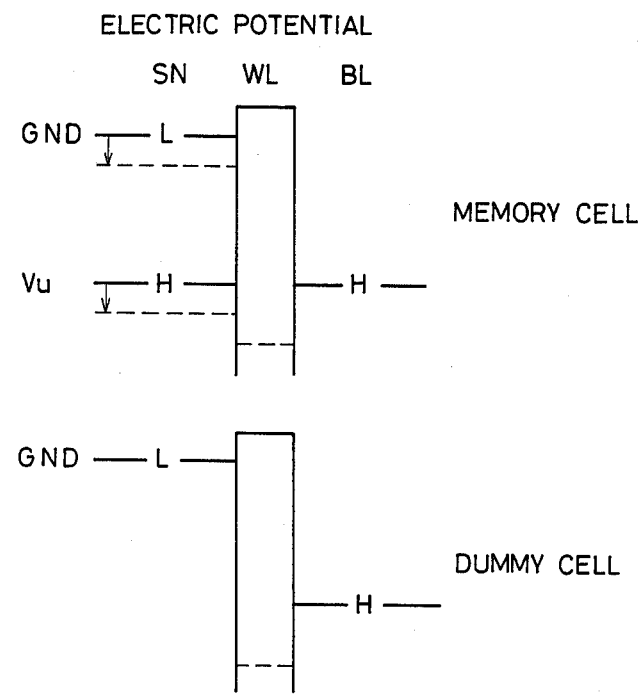
FIG. 7A is a diagram of potential for describing the read voltage loss in a conventional device.
Figure 7B:
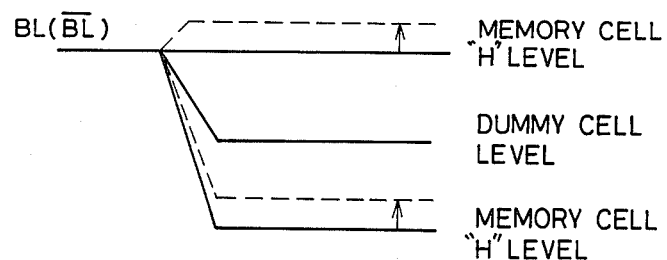
FIG. 7B is a diagram of voltage waveform for describing the read voltage loss in a conventional device.

FIG. 7A is a potential diagram illustrating the charge storage conditions of the memory cell and the dummy cell in case where there is a potential fluctuation in the storage node SN while FIG. 7B shows the read voltage to the bit lines on that occasion. In FIGS. 7A and 7B, dotted lines show the case where there is a potential fluctuation in the storage node SN. Meanwhile, one example is shown herein in which the word line is bootstrapped at a level higher than the source potential Vu.

Referring to FIG. 7A, the storage node SN in the memory cell is fluctuated after the word line becomes low level, so that both low (L) and high (H) charge stored conditions of the memory cells are shifted in the positive direction. On the other hand, the dummy cells are fixed to the GND level during the fluctuate of the substrate potential, so that there arises no potential fluctuate in the storage node SN. Consequently, in the following active cycle, the low level read voltage of the memory cell is lost as shown in the read voltage waveform of FIG. 7B.

Figure 1:
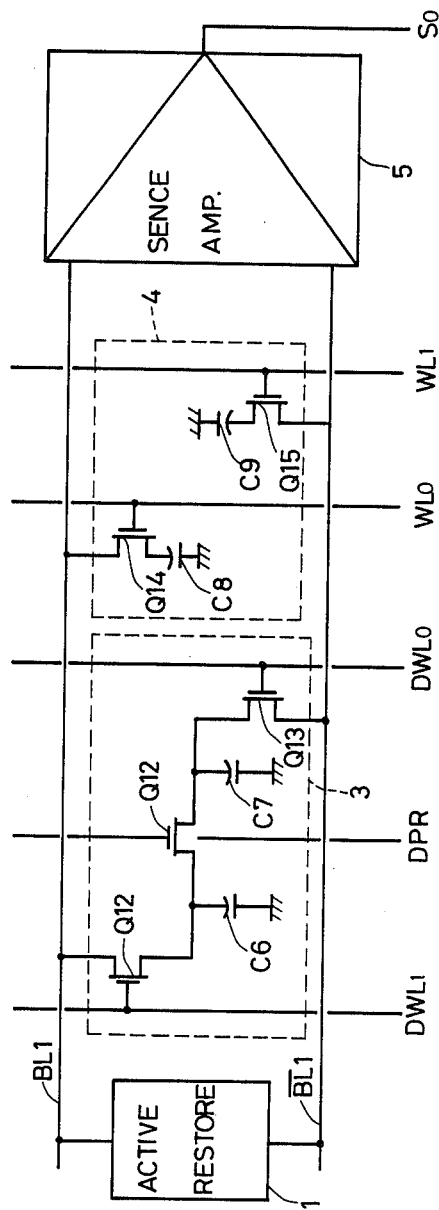
FIG. 1 is a schematic diagram showing one example of the present invention.

FIG. 1 is a schematic diagram showing the structure of one embodiment of the present invention. In FIG. 1, reference numeral 1 denotes an active restore circuit, reference characters BL1 and $\overline{BL1}$ denote bit lines, reference numeral 3 denotes a full-sized dummy cell, reference numeral 4 denotes a memory cell, reference numeral 5 denotes a sense amplifier, reference characters DWL$_0$ and DWL$_1$ denote dummy word lines, reference characters WL$_0$ and WL$_1$ denote word lines, reference character DPR denotes a dummy cell precharge signal line, reference character S$_0$ denotes a sense activating signal line, reference characters Q11 to Q15 denote MOS transistors and reference characters C6 to C9 denote MOS capacitors having capacitance values equal to each other.

Figure 2:
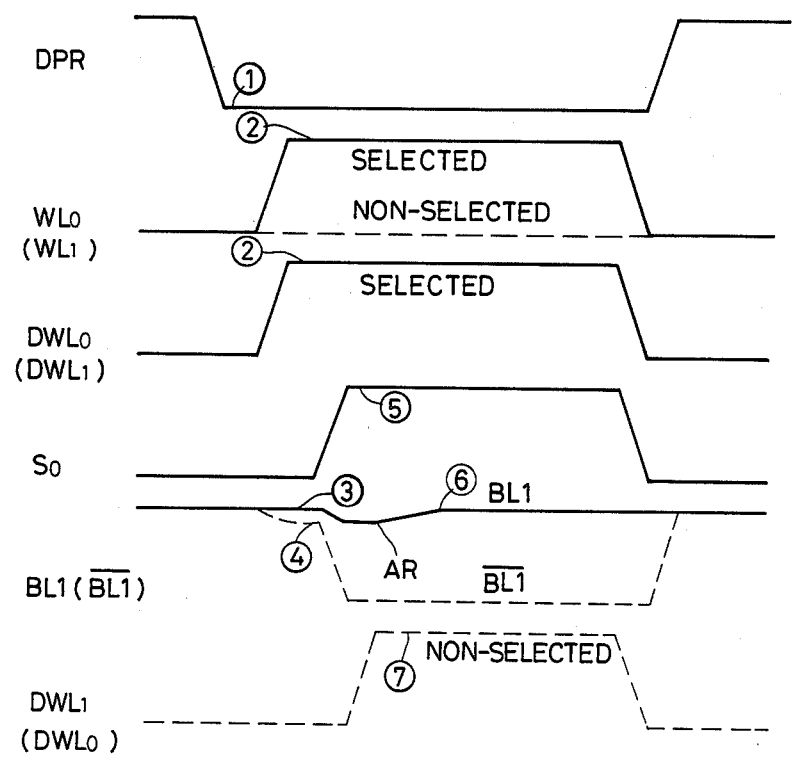
FIG. 2 is a diagram of waveforms illustrating the principle of an operation of the circuit according to one embodiment of the present invention shown in FIG. 1.

FIG. 2 is a diagram of waveforms illustrating an operation of the circuit shown in FIG. 1.

The principle of the operation of the circuit shown in FIG. 1 will be described with reference to the waveforms shown in FIG. 2. Circled numerals in the description show portions to be referred to in FIG. 2.

Now, let us assume that a ½Vu level charge is stored in the dummy cell capacitances C6 and C7 and a Vu level charge is stored in the memory cell capacitance C8. The RAM proceeds to an active period ① and a word line WL$_0$ and a dummy word line DWL$_0$, for example, are selected to be at a high level ②. Consequently, the level of the bit line $\overline{BL1}$ does not change as at ③, while the level of the bit line BL1 lowers by the voltage obtained from dividing the stored charge amount (½Vu×C7 capacitance value) by the bit line capacitance. The amount of this level drop is a half of the amount of the level drop of the bit line BL1 in case where the GND level is stored in the memory cell capacitance, as will be easily understood.

Then, the sense activating signal line S$_0$ becomes a high level ⑤, the sense is activated and the bit line BL1 is detected to be at a high level and the bit line $\overline{BL1}$ is detected to be at a low level. The bit line BL1 which is at the high level is retained at the Vu level by the active restore circuit 1 ⑥.

After the completion of sensing during the active period, the not-selected dummy word line DWL₁ is raised to a high ⑦. Consequently, the Vu level is written into the dummy circuit capacitance C6. Since the selected dummy word line DWL₀ is maintained at a high level during the active period, the GND level is charged to the dummy circuit capacitance C7.

Then, all word lines and dummy word lines are lowered to the low level and the DPR signal line becomes a high level, so that the dummy cell capacitances C6 and C7 are equalized. Consequently, the levels of the dummy circuit capacitances C6 and C7 become the ½Vu level again.

As described above, the read level of the dummy cell becomes a half of the low read level of the memory cell, thereby enabling the operation of the memory cell.

Figure 8A:
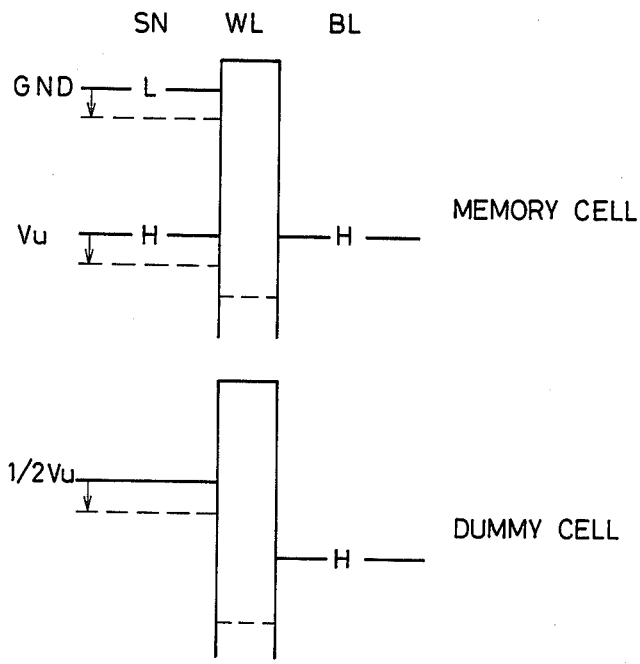
FIG. 8A is a diagram of potential in one embodiment of the present invention.
Figure 8B:
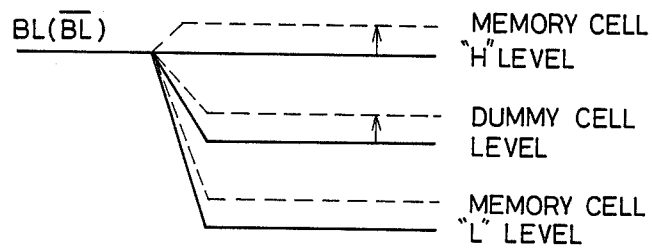
FIG. 8B is a diagram of read voltage waveform in one embodiment of the present invention.

The effects obtained from the circuit according to the above described embodiment will be hereinafter described with reference to the potential diagram and the read voltage waveform diagram of FIGS. 8A and 8B. Meanwhile, dotted lines in FIGS. 8A and 8B show the case where there is a fluctuation in the substrate potential $V_{BB}$.

When the substrate potential $V_{BB}$ fluctuates, in the memory cell the stored information levels of low (L) and high (H) are shifted in the positive direction, as is the same in a conventional device. One the other hand, since a dummy cell has the same structure as a common memory cell, both the information of the dummy cell to which the Vu level is written and the information of the dummy cell to which the GND level is written are shifted to the positive direction as much as the memory cell information. Therefore, the equalized dummy cell information is shifted in the positive direction by the same amount from the ½Vu level. Consequently, the read level of the dummy cell becomes the intermediate of the high and low read levels of the memory cell, as is the same as in the case where there is no fluctuation in the substrate potential, whereby the read level loss can be eliminated.

In addition, according to this embodiment, the selected dummy word line need not be set at a prescribed level before sensing and it may be maintained at a high level similar to the word lines of the memory cell during the active period. Therefore, the time required for lowering the selected dummy word line to the low level before sensing is eliminated, thereby preventing the loss of the access time One embodiment of a decoder for applying the aforementioned dummy word line driving signal to the circuit of FIG. 1 will be hereinafter described.

Figure 9:
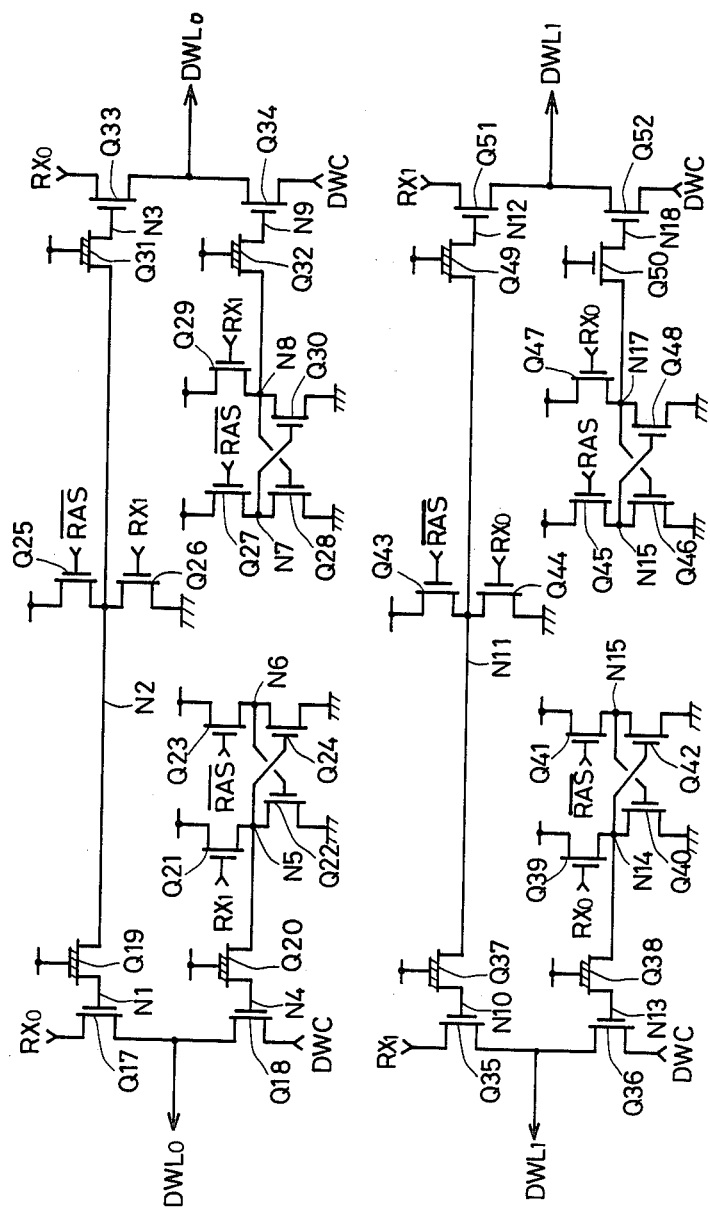
FIG. 9 is a schematic diagram showing the structure of a decoder according to one embodiment of the present invention.
Figure 10:
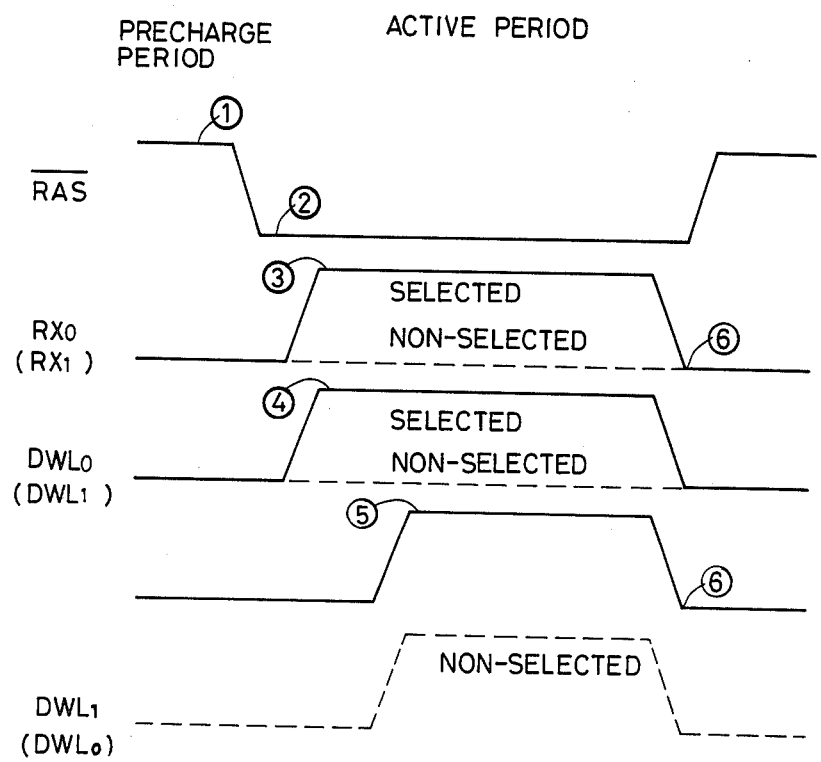
FIG. 10 is a diagram of waveforms illustrating the principle of operation of the circuit according to one embodiment of the present invention shown in FIG. 9.

FIG. 9 is a schematic diagram of one embodiment of a decoder performing the aforementioned operation and FIG. 10 is a diagram of waveforms illustrating the operation of the decoder shown in FIG. 9. In FIG. 9, reference characters Q17 to Q52 denote MOS transistors, reference characters N1 to N18 are node numbers, reference characters RX₀ and RX₁ denote sub decoded word line driving signals, reference character DWC denotes a dummy word line driving signal and reference character $\overline{RAS}$ denotes a signal synchronized with the external $\overline{RAS}$. Since the circuit of FIG. 9 is structured symmetrically, only the circuit of the left side will be hereinafter described. Circled numerals in the description show portions to be referred to in the waveforms shown in FIG. 10.

During the precharge period of the RAM, $\overline{RAS}$ signal is at a high level ① and hence nodes N1, N2, N6, N10, N11 and N15 are charged to the high level. Then, proceeding to the active period, $\overline{RAS}$ signal becomes low level ② and the subdecoded selected word line driving signal RX₀ becomes high level ③, then the selected dummy word line DWL₀ becomes high level through a transistor Q17 ④. A transrstor Q39 is turned on and nodes N13 and N14 become a high level, while a not-selected dummy word line DWL1 is maintained at a low level since the dummy word line driving signal DWC is still at a low level. A transistor Q44 is turned on, nodes N10 and N11 are at a low level and a transistor Q35 is turned off.

After the completion of sensing, the dummy word line driving signal DWC becomes a high level ⑤ and the not-selected dummy word line DWL1 becomes a high level through the transistor Q36. By simultaneously lowering the word line driving signal RX₀ and the dummy word line driving signal DWC to the low level ⑥, the driving of the not-selected dummy word line in the above described embodiment can be carried out.

Although only one memory cell is connected to the bit line pair in the circuit of FIG. 1 for convenience of description in the foregoing, it goes without saying that a number of memory cells are connected to a pair of the bit lines in an actual circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic RAM having with an active period and a precharge period for processing a signal, comprising
   a pair of bit lines including a first bit line and a second bit line,
   a first memory capacitor,
   first switching means connected between said first bit line and said first memory capacitor for selectively connecting said first memory capacitor to said first bit line,
   a first word line for controlling said first switching means,
   a second memory capacitor having the same capacitance as said first memory capacitor,
   second switching means connected between said second bit line and said second memory capacitor for selectively connecting said second memory capacitor to said second bit line,
   a second word line for controlling said second switching means,
   a first dummy capacitor having the same capacitance as said first memory capacitor,
   third switching means connected between said first bit line and said first dummy capacitor for selectively connecting said first dummy capacitor to said first bit line,
   a first dummy word line for controlling said third switching means,
   a second dummy capacitor having the same capacitance as said first memory capacitor,
   fourth switching means connected between said second bit line and said second dummy capacitor for selectively connecting said second dummy capacitor to said second bit line,
   a second dummy word line for controlling said fourth switching means, fifth switching means connected between said first dummy capacitor and second dummy capacitor for equalizing said first and second dummy capacitors, a sense amplifier connected to said pair of bit lines for sensing said pair of bit lines during said active period, word line driving means for selectively outputting a first word line signal or a second word line signal before said sensing during said active period, said first word line signal driving said first word line and rendering said first switching means conductive, said second word line signal driving said second word line and rendering said second switching means conductive, first dummy word line driving means for selectively outputting a first dummy word line signal or a second dummy word line signal before said sensing during said active period, said first dummy word line signal driving said first dummy word line and rendering said third switching means conductive, said second dummy word line signal driving said second dummy word line and rendering said fourth switching means conductive, said first dummy word line signal being outputted in response to said second word line signal and said second dummy word line signal being outputted in response to said first word line signal, second dummy word line driving means for outputting a DWC signal for rendering said third and fourth switching means conductive after said sensing during said active period, and equalizing signal outputting means for rendering said fifth switching means conductive to equalize said first and second dummy capacitors during said precharge period after said active period.

2. A dynamic RAM in accordance with claim 1, wherein said first dummy word line driving means further comprises a first decoder having an adapting terminal of said first word line signal, a second decoder having an adapting terminal of said DWC signal, said first decoder being activated and said second decoder being unactivated in response to said first word line signal, and a third decoder having an adapting terminal of said second word line signal, a fourth decoder having an adapting terminal of said DWC signal, said third decoder being activated and said fourth decoder being unactivated in response to said second word line signal.

3. A dynamic RAM in accordance with claim 1, wherein said first and second memory capacitors comprising cell plates, respectively, a potential in each of said cell plates being as a half of a source potential.

* * * * *